United States Patent [19]
O'Sullivan

[11] Patent Number: 5,900,784
[45] Date of Patent: May 4, 1999

[54] VERY LOW-GAIN VOLTAGE CONTROLLED OSCILLATOR

[75] Inventor: Eugene O'Sullivan, Tokyo, Japan

[73] Assignee: NEC Corporation, Tokyo, Japan

[21] Appl. No.: 08/908,053

[22] Filed: Aug. 11, 1997

[30] Foreign Application Priority Data

Aug. 14, 1996 [JP] Japan .................................. 8-214472

[51] Int. Cl.$^6$ .................................................. H03L 7/099
[52] U.S. Cl. ................................ 331/2; 331/16; 331/185; 331/1 A; 327/156; 327/159
[58] Field of Search ................................. 331/45, 57, 17, 331/1 A, 2, 16, 185; 327/156

[56] References Cited

U.S. PATENT DOCUMENTS

| | | | |
|---|---|---|---|
| 4,876,519 | 10/1989 | Davis et al. ............................. | 331/57 |
| 5,298,870 | 3/1994 | Cytera et al. ............................ | 331/45 |
| 5,300,898 | 4/1994 | Chen et al. .............................. | 331/57 |
| 5,331,295 | 7/1994 | Jelinek et al. .......................... | 331/57 |
| 5,359,301 | 10/1994 | Candage .................................. | 331/57 |

FOREIGN PATENT DOCUMENTS

| | | |
|---|---|---|
| 5-41663 | 2/1993 | Japan . |
| 6-303032 | 10/1994 | Japan . |
| 7-86929 | 3/1995 | Japan . |
| 8-8735 | 1/1996 | Japan . |
| 8-84073 | 3/1996 | Japan . |
| 8-139597 | 5/1996 | Japan . |

*Primary Examiner*—Arnold Kinkead
*Attorney, Agent, or Firm*—Sughrue, Mion, Zinn, Macpeak & Seas, PLLC

[57] ABSTRACT

The use of a control circuit (160) with either a programmable divider or divider(s) (190) and multiplexer (200) guarantees that, irrespective of the process variations, a voltage controlled oscillator has a low gain Vin-Fout characteristic in the desired frequency range. Low-gain voltage controlled oscillators are fundamental building blocks of low-jitter phase-locked loop (PLL) systems. The programmable divider/divider(s) (190) and multiplexer (200) are placed at an output of a current controlled oscillator(s) (180). A control circuit (160) defines the optimum current range(s) in the current controlled oscillator(s) (180). In the case of when a programmable divider is used, the control circuit (160) keeps changing the division ratio of the programmable divider until the PLL eventually achieves the "locked" state. When divider(s) and a multiplexer (200) are used, the control circuit (160) keeps changing the selected multiplexer input until the "locked" state has been achieved. Only one current controlled oscillator is achieve at any one time. This control circuit could be for example an auto-lock circuit.

11 Claims, 11 Drawing Sheets

VERY LOW-GAIN VOLTAGE CONTROLLED OSCILLATOR

BACKGROUND OF THE INVENTION:

This invention relates to all voltage controlled oscillators (VCOS) and particularly those used in phaselocked loop systems.

A voltage controlled oscillator is a device whose output frequency (Fout) is a function of its input voltage (Vin). A VCO is often used to track a reference signal. It does this by using a phase-locked loop. A phase detector compares the phase of the reference input signal (Fref) and the divided VCO output signal (Fout/N, N=1, 2, 3, 4, . . . ). Depending on this phase difference, the input node of the VCO is either charged or discharged, thereby altering the VCO's frequency of oscillation. When the frequencies of the two phase detector input signals are matched within a given error margin, the PLL is then said to be "locked" to the reference signal. VCO design is critical in determining the overall performance of a PLL. The VCO's stability to small fluctuations in its input voltage is very important in determining PLL stability and jitter. Jitter can be thought of as spurious variations in the time positions of a series of successive pulses. Let's now look at the typical characteristic of a VCO.

The VCO characteristic shown in FIG. 1 assumes for simplicity sake that as the DC input voltage (Vin) increase, the output frequency (Fout) also increase. Of course, the reverse characteristic also exists. While temperature and power-supply variations will cause the oscillation frequency to change (indicated by <-> in FIG. 1), the far biggest influence on where the characteristic ultimately lies and its slope is the actual process condition ("bst", "typ" and "wst") at the time of manufacture. "bst" represents the process condition (resistor value, transistors parameter values, wire capacitance value) which results in highest output speed, "typ" represents those values which result in average output speed while "wst" represents those values which result in lowest speed. FIG. 1 assumes typical temperature and power-supply conditions.

The input voltage ranges (Va, Vb, Vc) which produce the actual required output target Fout(target) frequency range depend heavily on the process condition. Consequently, the current range (Ia, Ib and Ic) shown in the I-Fout characteristic of FIG. 2) which a current controlled oscillator requires to produce oscillations in the Fout(target) frequency range changes drastically from one process condition to another. The required current range (Ic) is widest in the worst ("wst") process condition and narrowest (Ia) in the best ("bst") process condition.

FIG. 3 shows a conventional VCO. The conventional VCO 140' comprises a bias generator 170' for generating a bias voltage in response to a DC input voltage (Vin) and a single current controlled oscillator 180' for generating an output signal having an output frequency (Fout) in response to the bias voltage. Such conventional VCOs are disclosed in, for example, U.S. Pat. No. 4,876,519 issued to Craig M. Davis et al., U.S. Pat. No. 5,331,295 issued to Jules J. Jelinek et al., U.S. Pat. No. 5,359,301 issued to Anthony B. Candage, U.S. Pat. No. 5,300,898 issued to Dao-Longe Chen et al., and U.S. Pat. No. 5,298,870 issued to Christopher Cytera et al.

Traditionally, irrespective of the process condition, a fixed current range (Itrad) has been used to produce the required Fout(target). See FIG. 2. Hence, the same current range is supplied to the VCO 140' in FIG. 3 in the worst case where a large current range (Ic) is required to produce oscillations in the Fout(target) frequency range as it is in the best case where in contrast only a small current range (Ia) is needed. It will now be illustrated with an example that using this traditional approach, small fluctuations in input current can produce significant shifts in output frequency and hence, increase jitter and degrade system stability.

For example let's assume that:
(a) Itrand=250 μA, Ia=20 μA, Ib=40 μA and Ic=90 μA,
(b) the VCO operates over a Ftarget=120 MHz frequency range,
(c) that a 50 mV fluctuation in input voltage produces a (Itrand/50) variation in input current.

This 5 μA change in input current will produce a 30 MHz, 15 MHz and 6.67 MHz change in oscillation frequency for a "bst", "typ" and "wst" case process condition, respectively. In fact, the steeper the slope (gain) of the I-Fout characteristic, the bigger the frequency shift. Consequently, system stability is degraded and jitter increase.

SUMMARY OF THE INVENTION:

It is therefore an object of this invention to provide a very low-gain voltage controlled oscillator which is capable of improving system stability.

It is another object of this invention to provide a very low-gain voltage controlled oscillator of the type described, which is capable of decreasing jitter.

Other objects of this invention will become clear as the description proceeds.

Thus in conclusion to produce low jitter, a VCO is needed which has low gain in the target Fout(target) frequency range irrespective of process variations. While the "typ" and "bst" I-Fout characteristics have high gain in the desired Fout(target) frequency range shown in FIG. 2, they have very low gain in much higher frequency ranges, namely M*Fout(target) and P*Fout(target), respectively. Consequently, by forcing the "typ" and "bst" current controlled oscillators to operate in the M*Fout(target) and P*Fout(target) low-gain frequency ranges, respectively and then using dividers M and P at their respective outputs, a very stable and low jitter Fout(target) PLL system can be achieved irrespective of process variations. A control circuit is used to provide the optimum current range to each current controlled oscillator and select the appropriate current controlled oscillator output so as to enable lock.

This present invention guarantees that irrespective of process variations, a voltage controlled oscillator has very low gain I-Fout characteristics in the Fout(target) frequency range.

Bias control signals BC1 to BCN from a control circuit determines which one of bias output signals BG1 to BGN of a bias generator is active at any one time. The active (BG1 to BGN) bias output signal defines a unique current range in one of the current controlled oscillators in the current controlled oscillator block and hence a unique output frequency range. Only one of the current oscillators is ON at any one time. Control signals CT1 to CTN determine which one of the multiplexer inputs is active at any one time.

By using multiple current controlled oscillators and/or dividers, it is possible to generate very low gain voltage controlled oscillator characteristics in the Fout(target) frequency range irrespective of process variations. The current controlled oscillators I-Fout characteristic should be optimized for each type ("bst", "typ" and "wst") of process chip. A control circuit is used to command the bias generator to supply each type of current controlled oscillator with its optimum current range and to select the current controlled oscillator which produce oscillations in the desired Fout (target) frequency range.

Figure 4:
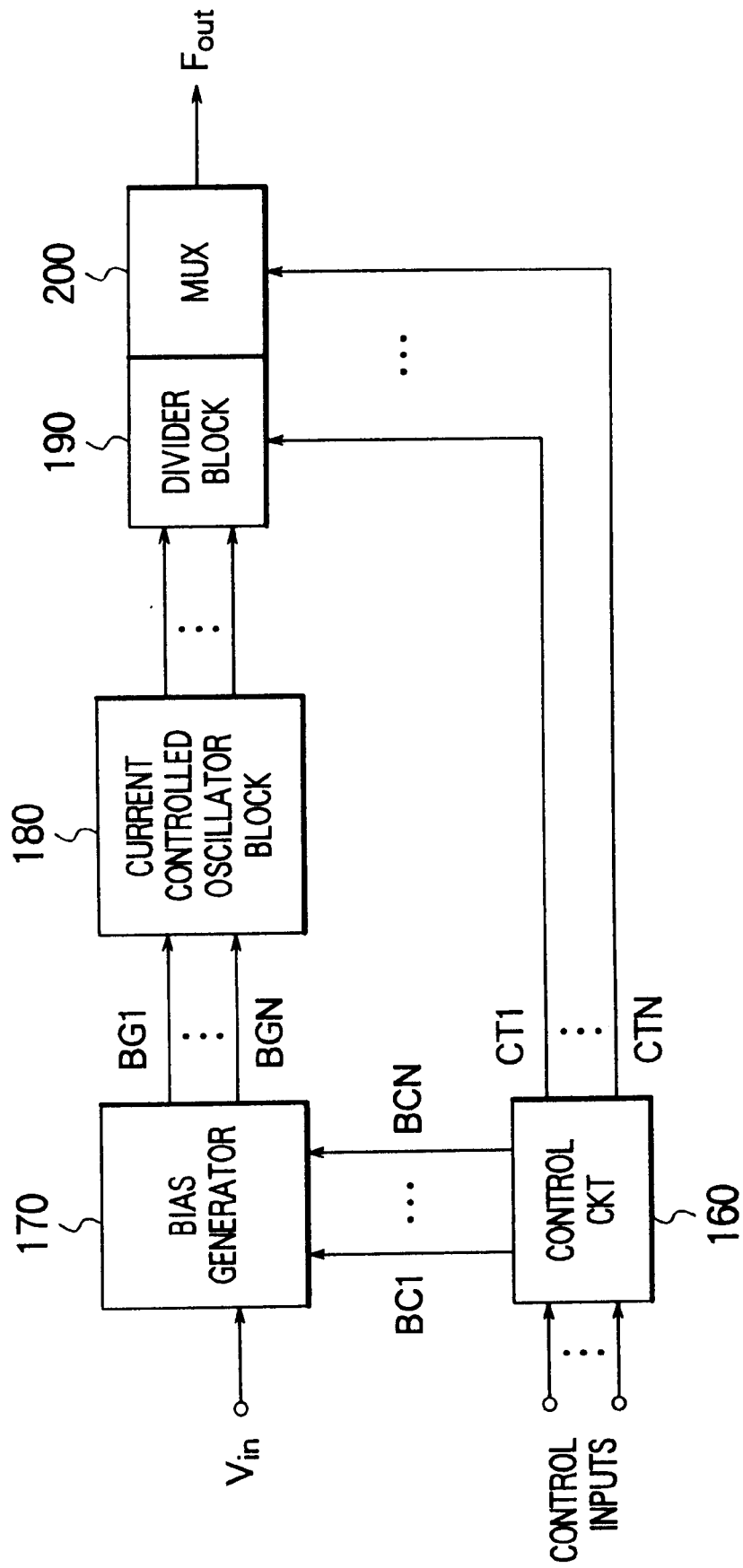
FIG. 4 shows a block diagram of a very low-gain voltage controlled oscillator according to the present invention.

DESCRIPTION OF THE PREFERRED EMBODIMENTS:

Referring to FIG. 4, description will proceed to a very low-gain voltage controlled oscillator according to the present invention. The illustrated very low-gain voltage controlled oscillator guarantees that the I-Fout characteristic of the VCO has low gain in the desired Fout(target) frequency range irrespective of process variations. The VCO consists of a control circuit 160, a bias generator 170, a current controlled oscillator block 180, a divider block 190, and an n–1 multiplexer 200. The current controlled oscillator block 180 contains one or more current controlled oscillators (not shown) which will later become clear.

The bias generator 170 responds to a DC input voltage Vin and bias control signals (BC1 to BCN) from the control circuit 160 to produce one or more bias output signals (BG1 to BGN). The output(s) of the bias generator 170 are connected input(s) of one or more current controlled oscillators in the current controlled oscillator (CCO) block 180. Each output of the current controlled oscillator is directly connected to a different input of the n–1 multiplexer 200 or an input of a divider with a fixed or programmable division ratio R (>1). The n–1 multiplexer 200 is only used if the divider block 190 has more than one output or in the case where no divider block is used, if more than one current controlled oscillator is used. The n–1 multiplexer 200 has n input signals and produces a single output frequency signal Fout. In the divider block 190 with fixed/programmable division ratio(s) R (R1, R2, . . . ), an input of each divider is connected to the output of a corresponding current controlled oscillator, an output of each divider is connected to a different input of the n–1 multiplexer 200. When a programmable divider block is used, the n–1 multiplexer is placed between the CCO block and the programmable divider block.

Description will proceed to operation of the VCO illustrated in FIG. 4.

The bias control signals BC1 to BCN from the control circuit 160 determine which one of the bias output signals BG1 to BGN of the bias generator 170 is active at any one time. The active (BG1 to BGN) bias output signal defines a unique current range in one of the current controlled oscillators in the current controlled oscillator block 180 and hence a unique output frequency range. Only one of the current controlled oscillators is ON at any one time. Selection control signals CT1 to CTN determine which one of the multiplexer 200 inputs is active at any one time.

Figure 3:
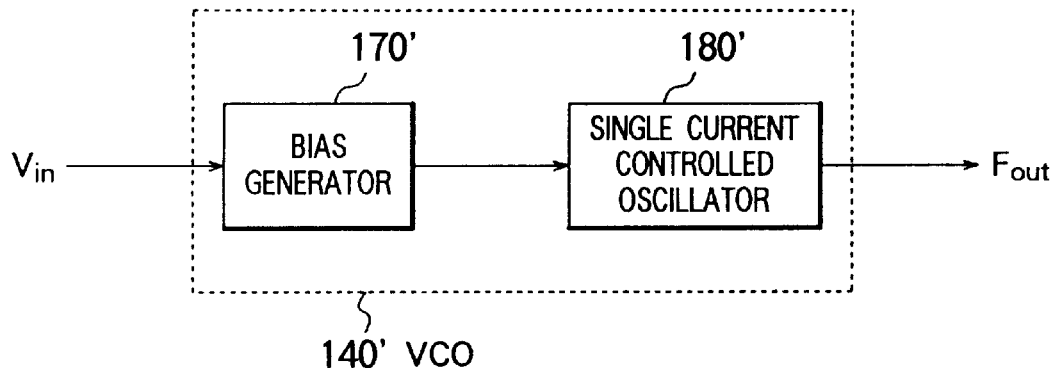
FIG. 3 shows a block diagram of a conventional voltage controlled oscillator.
Figure 5:
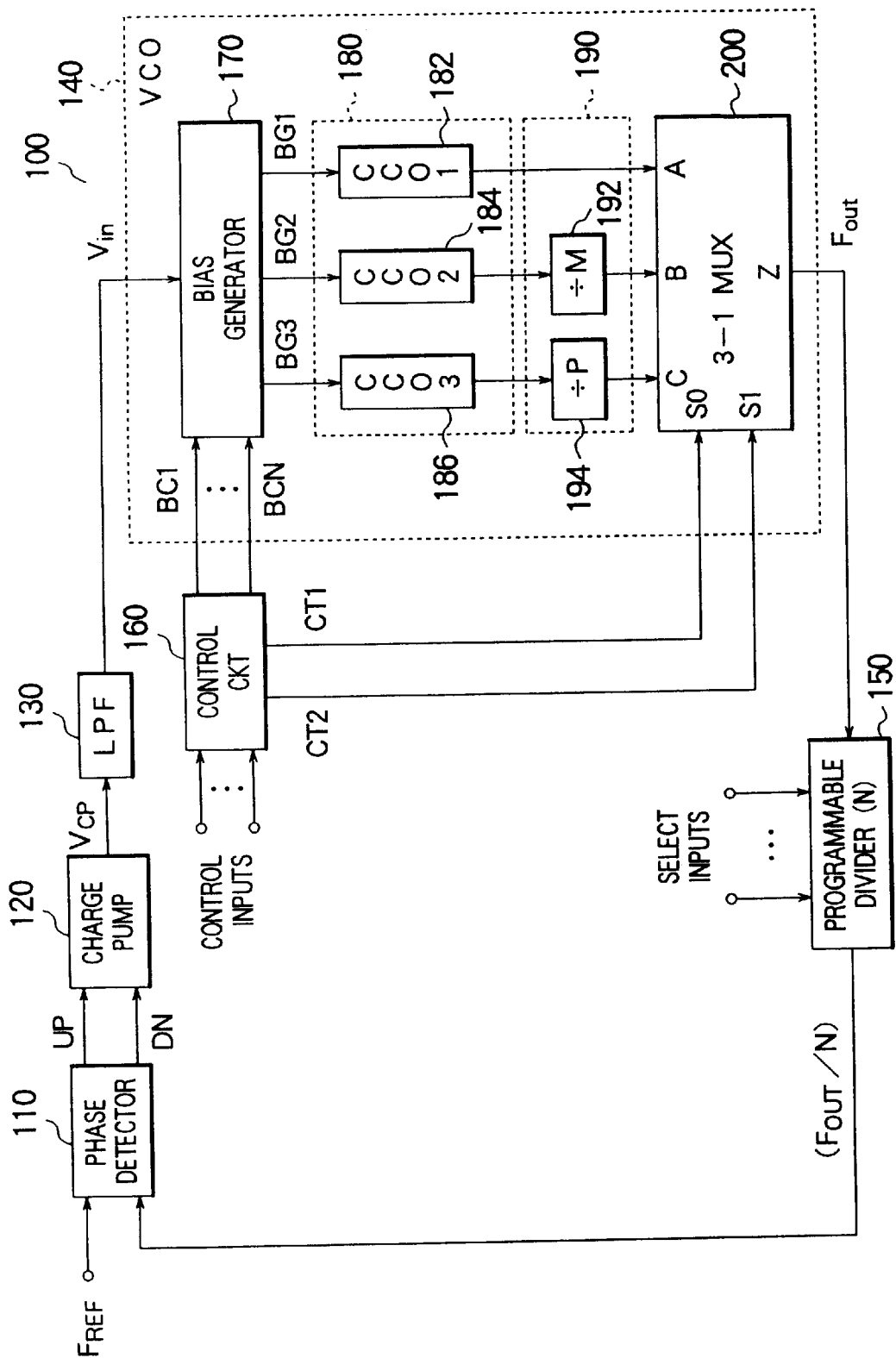
FIG. 5 shows a block diagram of a very low-gain voltage controlled oscillator according to a first embodiment of the invention incorporated in a phaselocked loop circuit.

FIG. 5 shows a very low-gain voltage controlled oscillator according to a first embodiment of the invention incorporated in a phase-locked loop circuit 100. A phase detector 110 responds to differences in phase between a reference signal Fref and a divided output signal (Fout/N) to produce two output signals UP and DN. When the frequency of the reference signal Fref is greater than the VCO's divided frequency of the divided output signal (Fout/N), the UP signal is high. And when the frequency of the reference signal Fref is less than the VCO's divided frequency of the divided output signal (Fout/N), the DN signal is high. A charge pump 120 generates a difference signal VCP in response to the input signals UP and DN. A low pass filter (LPF) 130 filters the VCP voltage signal and generates a Vin signal which is used to control the oscillation frequency of the VCO 140. A programmable divider 150 divides an output frequency signal Fout of the VCO 140 by an integer value N to produce the divided output signal (Fout/N). The integer value N of the programmable divider 150 is set by its select inputs. The VCO 140 is said to be in the synchronous state or "locked" state when the frequency of the reference signal Fref and the VCO's divided frequency of the divided output signal (Fout/N) are matched within an error margin. In contrast, the VCO 140 is said to be in the unsynchronous state or "unlocked" state when the frequency of the reference signal Fref and the VCO's divided frequency of the divided output signal (Fout/N) are unmatched within an error margin. The time taken for the PLL 100 to achieve the "locked" state is called the lock-up time, tlck. All the above mentioned blocks are general blocks that can be found in most phase-locked loop systems. "Normal PLL operation" involves only these blocks. The conventional VCO 140' shown in FIG. 3 just contains the bias generator 170' and the single current controlled oscillator 170'. The divider block and multiplexer at the output of the current controlled oscillator block together with the control circuit and the bias generator constitute the present invention.

Figure 1:
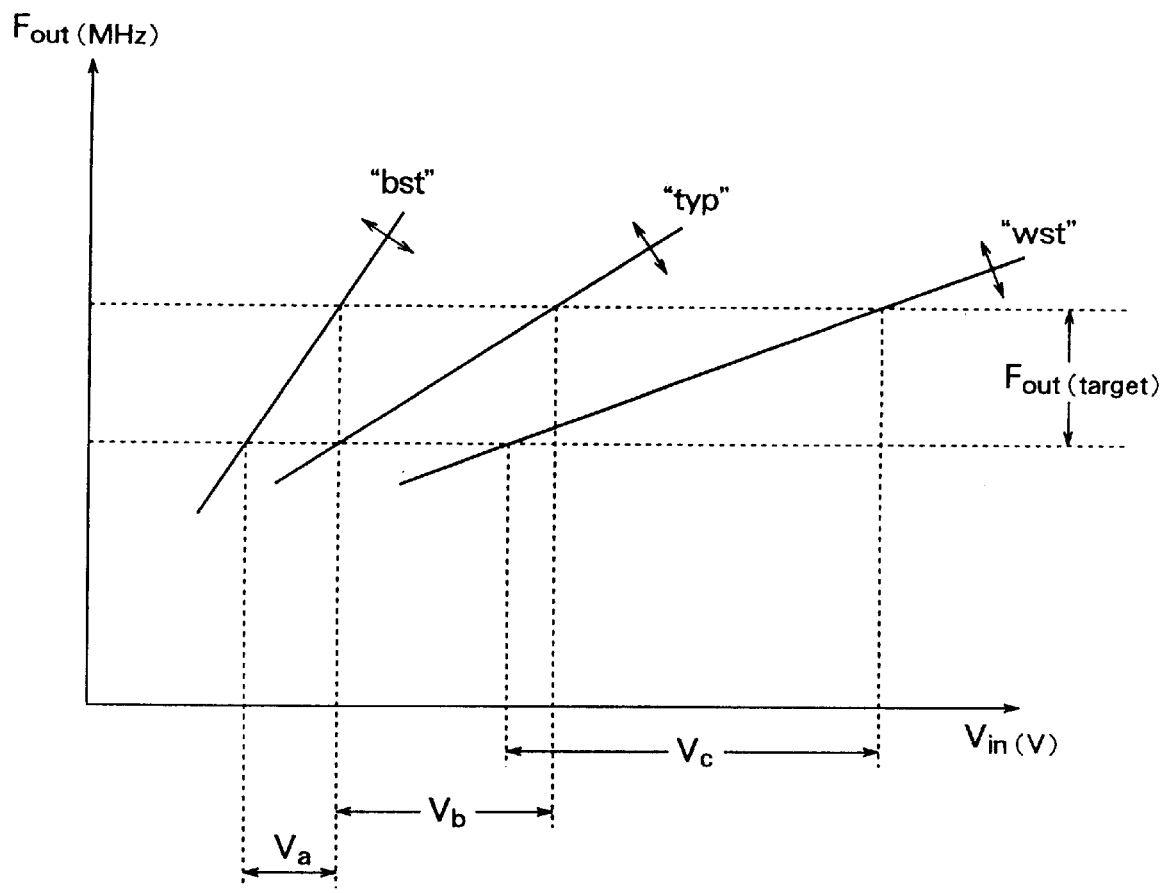
FIG. 1 shows a traditional VCO Vin-Fout characteristic.
Figure 2:
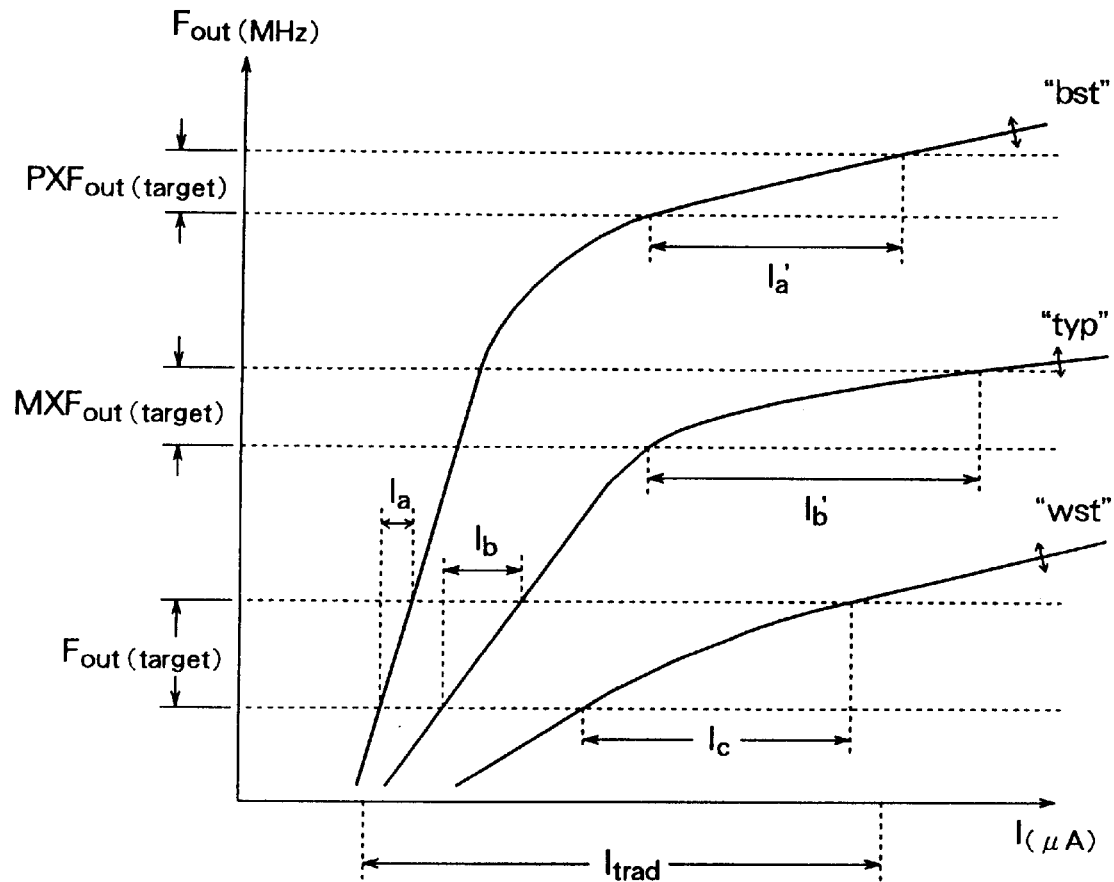
FIG. 2 shows a traditional Vco I-Fout characteristic.

The control circuit 160 commands the bias generator 170 to supply the "optimum current range" to each current controlled oscillator. "Optimum current range" means the input current range which corresponds to very low VCO gain. In FIG. 2, these ranges correspond to Ia', Ib' and Ic. Generally only one of its bias output signals (BG1 to BGN) is active at any one time. The selection control signal CT1 to CT2 of the control circuit 160 determines which one of the input signals (A, B, C) of the 3–1 multiplexer 200 is active at any one time.

The bias generator 170 accepts an input voltage Vin and depending on the bias control signals BC1 to BCN from the control circuit 160 decides which one of three current controlled oscillators (namely, CCO1, CCO2 and CCO3) is active at any one time. Consequently, only one of its bias output signals BG1, BG2 and BG3 is active at any one time.

The current controlled oscillator block 180 contains three current controlled oscillators, namely CCO1 (182), CCO2 (184) and CCO3 (186). only one of these current controlled oscillators is active at any one time. The reason for having three current controlled oscillators is to optimize the VCO characteristic for each type of process chip i.e. worst case ("wst"), typical case ("typ") and best case ("bst"). CCO1 is used for a worst case chip, CCO2 for a typical case chip and CCO3 for a best case chip. By providing each one of these current controlled oscillators with its "optimum current range", a VCO with very low gain I-Fout characteristics can be generated irrespective of process variations.

In the embodiment shown in FIG. 5, a divider block 190 is placed at the output of the current controlled oscillator block 180. It consists of two dividers, namely 192 and 194. A divider placed at the output of a current controlled oscillator is used to transfer its low-gain I-Fout characteristic to the desired Fout(target) frequency range. Hence, since CCO2 has a low-gain I-Fout frequency response at M times the desired Fout(target) frequency range, the divider 192 with a fixed division ratio M is required at the output of CCO2. Similarly, since CCO3 has a low-gain I-Fout characteristic at P times the desired Fout(target) frequency range, the divider 194 with a fixed division ratio P in needed at the output of CCO3.

The 3–1 multiplexer 200 placed at the output of the divider block 190 generates the output frequency signal Fout. Select signals S0 and S1 determine which one of the input signals (A, B or C) is selected.

The operation of the present invention is as follows. The control circuit 160 defines an initial "optimum current range" in the bias generator 170. Let's assume that this initial "optimum current range" corresponds to BG1=Vbg1 (>0), BG2=0 and BG3=0. The initial state of the select signals S0 and S1 (say "00" for example) selects one of the inputs of the 3–1 multiplexer 200 (in this case A). Therefore in this case, CCO1 oscillates but CCO2 and CCO3 do not. After a given time longer than tlck elapses, the control circuit 160 checks whether the PLL 100 has achieved the "locked" state or not. If is has, then the values of signals S0, S1, BC1 to BCN remain the same. "Normal PLL operation" adjusts the bias voltage of the reference signal Vin for temperature and supply variations to maintain lock. Otherwise the values of these signals are changed. A change in the values of the select signals S0 and S1 (e.g. "00" to "01") results in a different input of the 3–1 multiplexer 200 being selected (say B for example). A change in the values of the bias control signals BC1 to BCN results in a different "optimum current range" being defined in the bias generator 170 and hence a change in the values of the bias output signals BG1, BG2 and BG3 (in this case, BG1=0, BG2= Vbg2 (>0), BG3=1). Again after a given time longer than tlck elapses, the control circuit 160 checks whether the PLL 100 has achieved the "locked" state or not. If it has then the values of the signals S0, S1, BC1 to BCN remain the same. "Normal PLL operation" adjusts the bias voltage of the reference signal Vin for temperature and supply variations to maintain lock. Otherwise the values of these signals are changed. A change in the values of the select signals S0 and S1 (e.g. "01" to "10") results in the last input of the 3–1 multiplexer 200 being selected (in this case input C). A change in the value of the bias control signals BC1 to BCN results in a different "optimum current range" being defined in the bias generator 170 and hence a change in the values of the bias output signals BG1, BG2 and BG3 (in this case, BG1=0, BG2=0 V, BG3=Vbg3>0). The PLL 100 is guaranteed to reach the "locked" state using one of the three current controlled oscillators, which one depends on the type of process chip at the time of manufacture.

Figure 6:
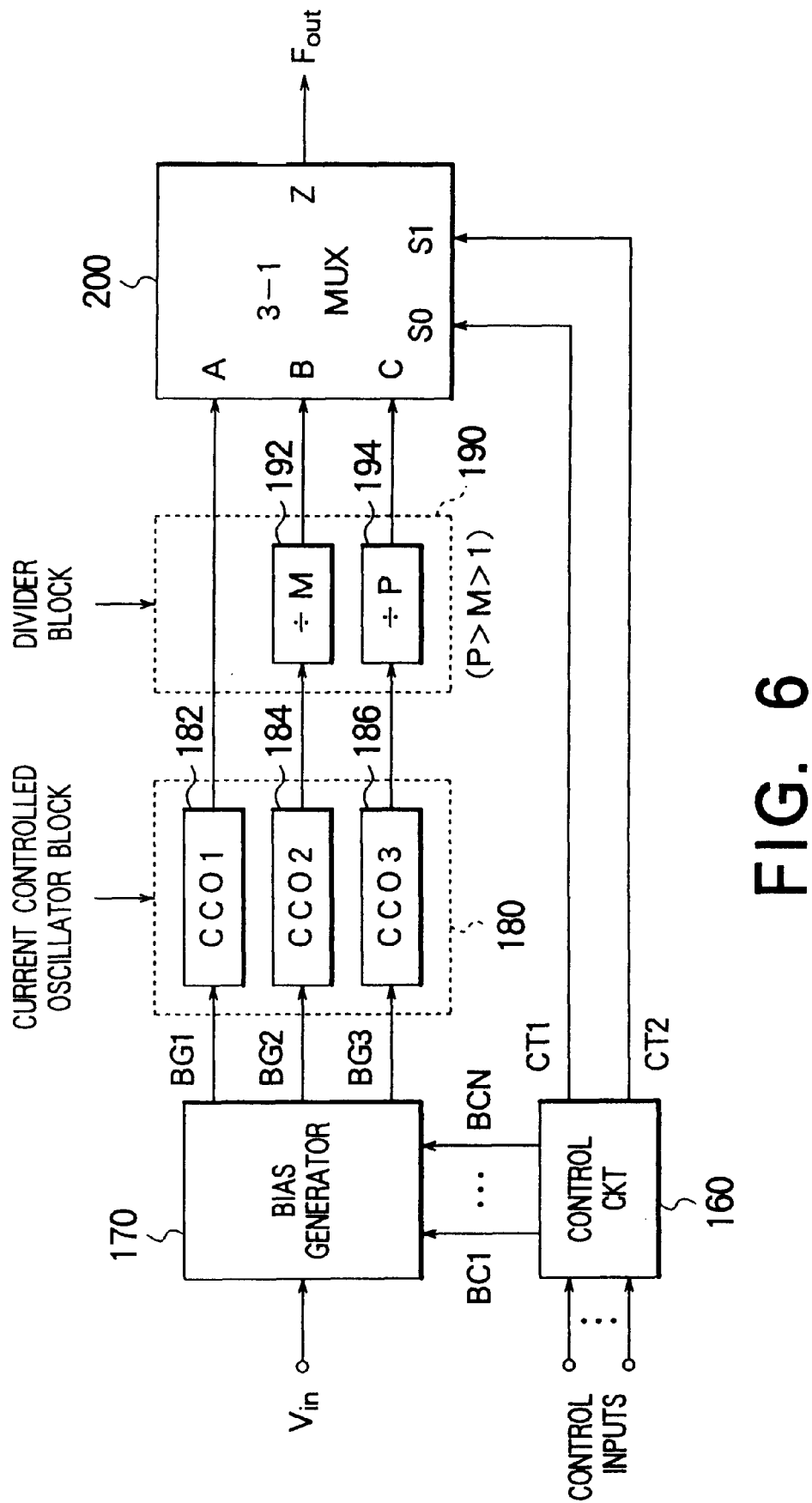
FIG. 6 shows a block diagram of the very low-gain voltage controlled oscillator according to the first embodiment of the invention.

In the first embodiment of the invention shown in FIG. 6, three current controlled oscillators CCO1, CCO2 and CCO3 are used to optimize the VCO characteristic for each type ("bst", "typ" and "wst") of process chip. The divider block 190 is used to transfer the low gain I-Fout characteristics of the current controlled oscillators CCO2 and CCO3 to the desired Fout(target) frequency range. Hence low gain I-Fout characteristics in the Fout(target) frequency range can be achieved irrespective of process variations.

While the divider block 190 is used in the first embodiment shown in FIG. 6, it is not always necessary. For example, the VCOs do not contain any divider block. In a sixth embodiment shown in FIG. 11, the I-Fout characteristic of each current controlled oscillator is optimized to have low gain in the desired Fout(target) frequency range. Therefore very low gain I-Fout characteristics can also be achieved by this approach which doesn't use a divider block. From a circuit size point of view, there is no real difference. Irrespective of whether a divider block is used or not, it is recommended to use three current controlled oscillators CCO1, CCO2 and CCO3 to achieve the best performance (i.e. lowest gain I-Fout characteristics).

Figure 7:
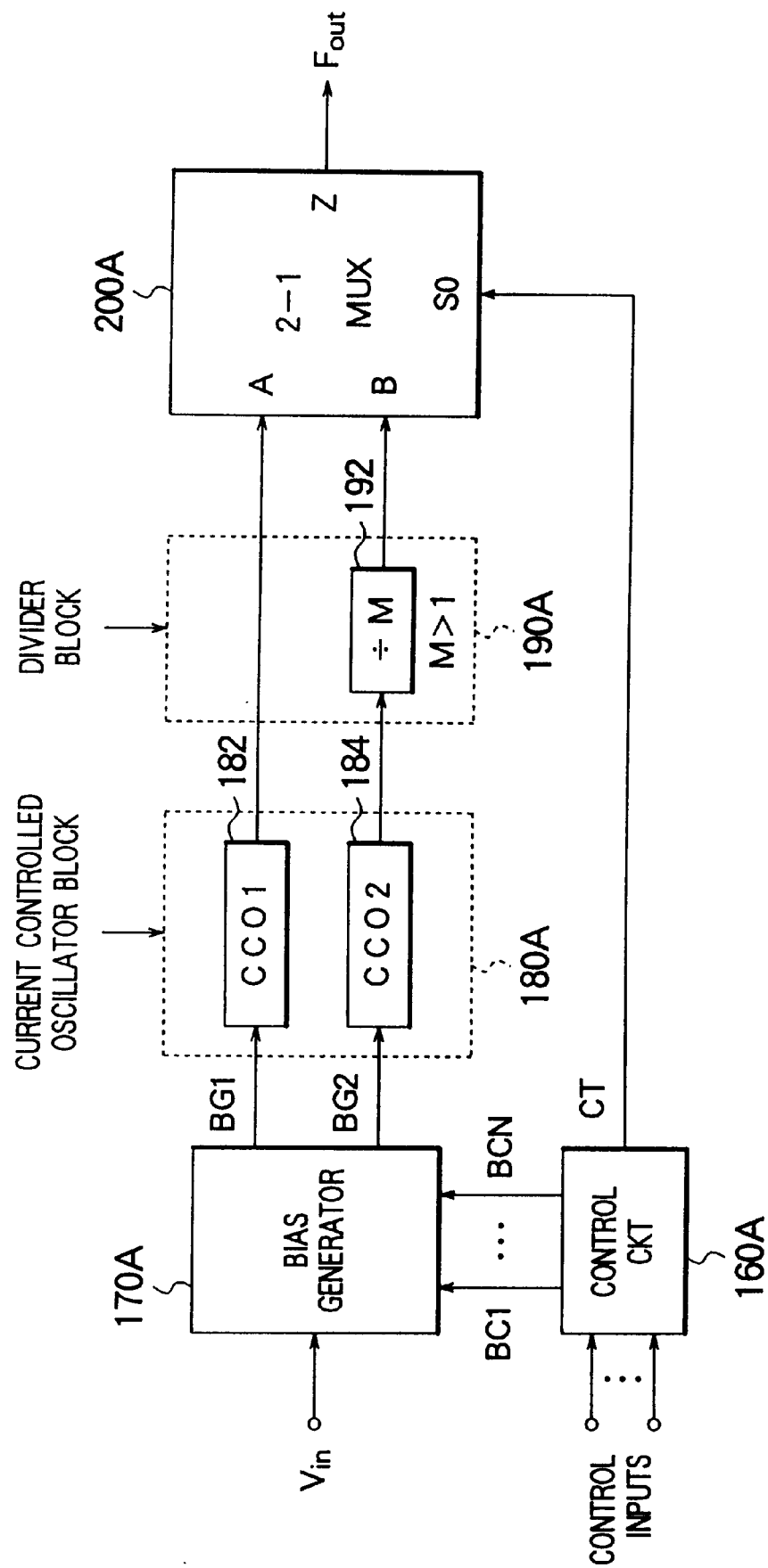
FIG. 7 shows a block diagram of a very low-gain voltage controlled oscillator according to a second embodiment of the invention.
Figure 11:
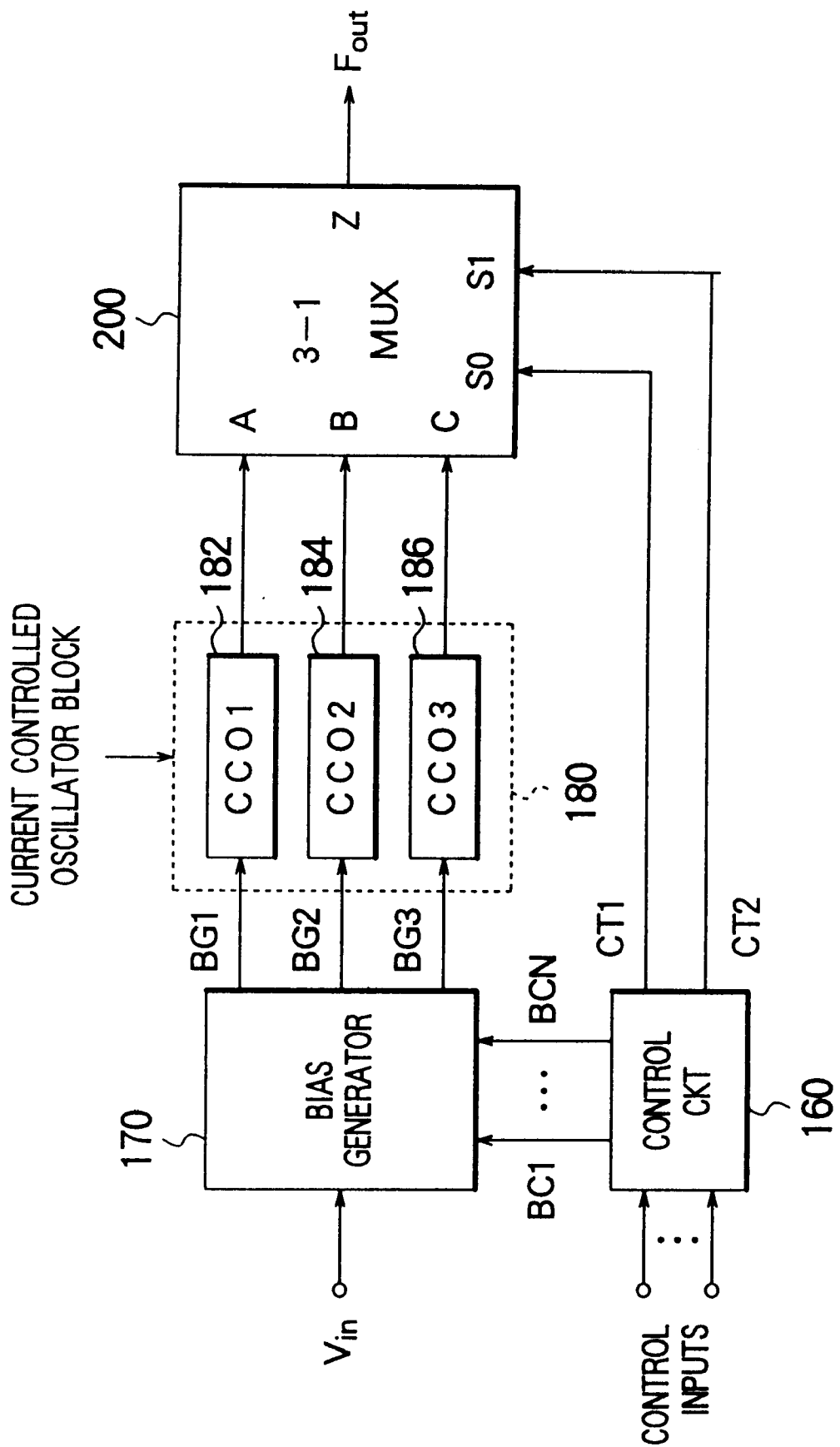
FIG. 11 shows a block diagram of a very low-gain voltage controlled oscillator according to a sixth embodiment of the invention.
Figure 12:
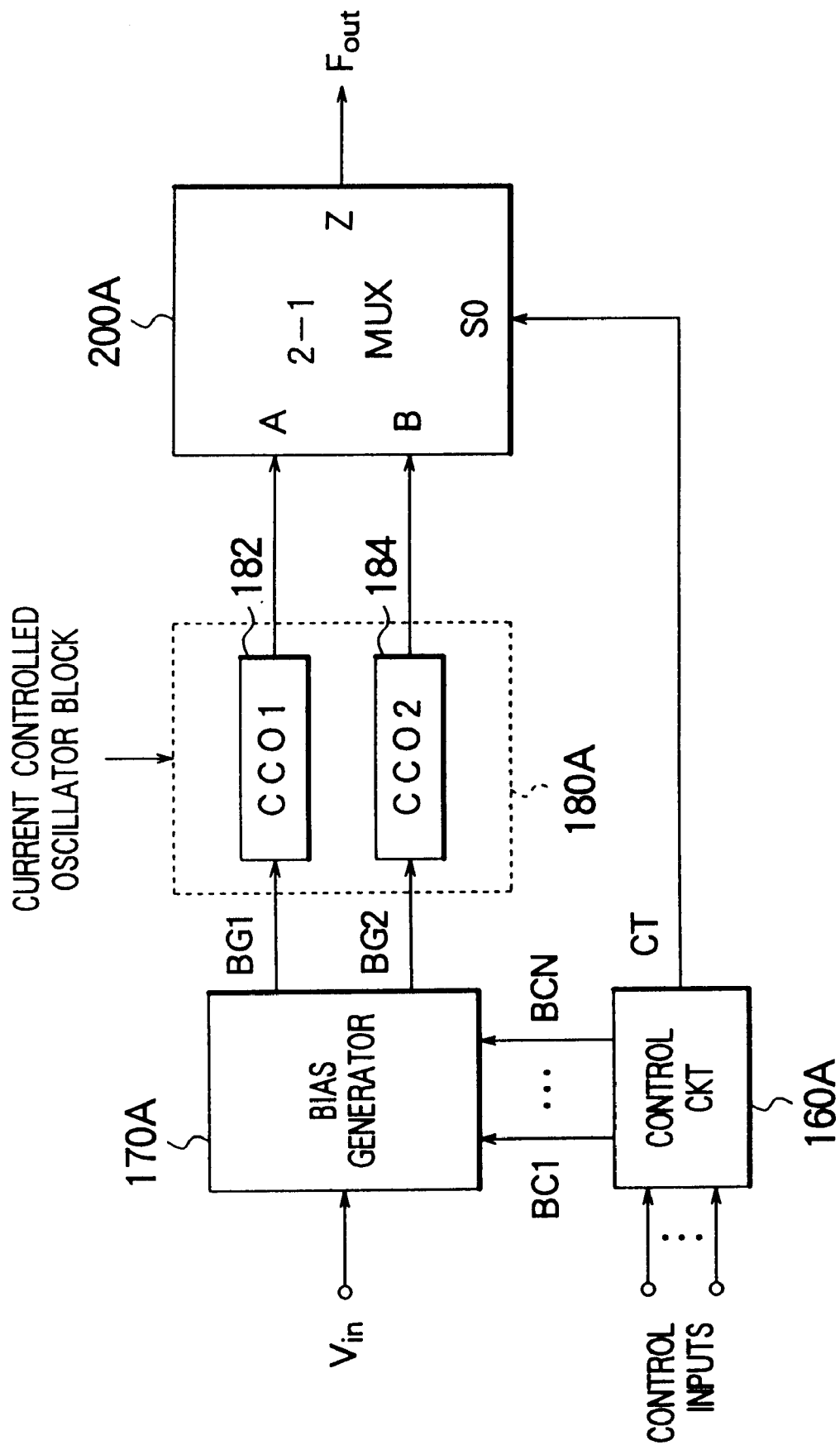
FIG. 12 shows a block diagram of a very low-gain voltage controlled oscillator according to a seventh embodiment of the invention.

While a second embodiment shown in FIG. 7 doesn't achieve as good performance as either FIG. 6 or FIG. 11, it can be implemented in a smaller area. The main difference between FIG. 6 and FIG. 7 is that FIG. 7 has only two current controlled oscillators CCO1, CCO2 and CCO3 as opposed to three in FIG. 6. CCO2 in FIG. 7 has a low gain I-Fout characteristic at M*Fout(target) and hence needs the divider 192 with division ratio M at its output to produce oscillations in the required Fout(target) frequency range. If however, the I-Fout characteristic of CCO2 is optimized to produce oscillations in the Fout(target) frequency range, the divider 192 with division ratio M is not needed, resulting in a seventh embodiment shown in FIG. 12.

Figure 9:
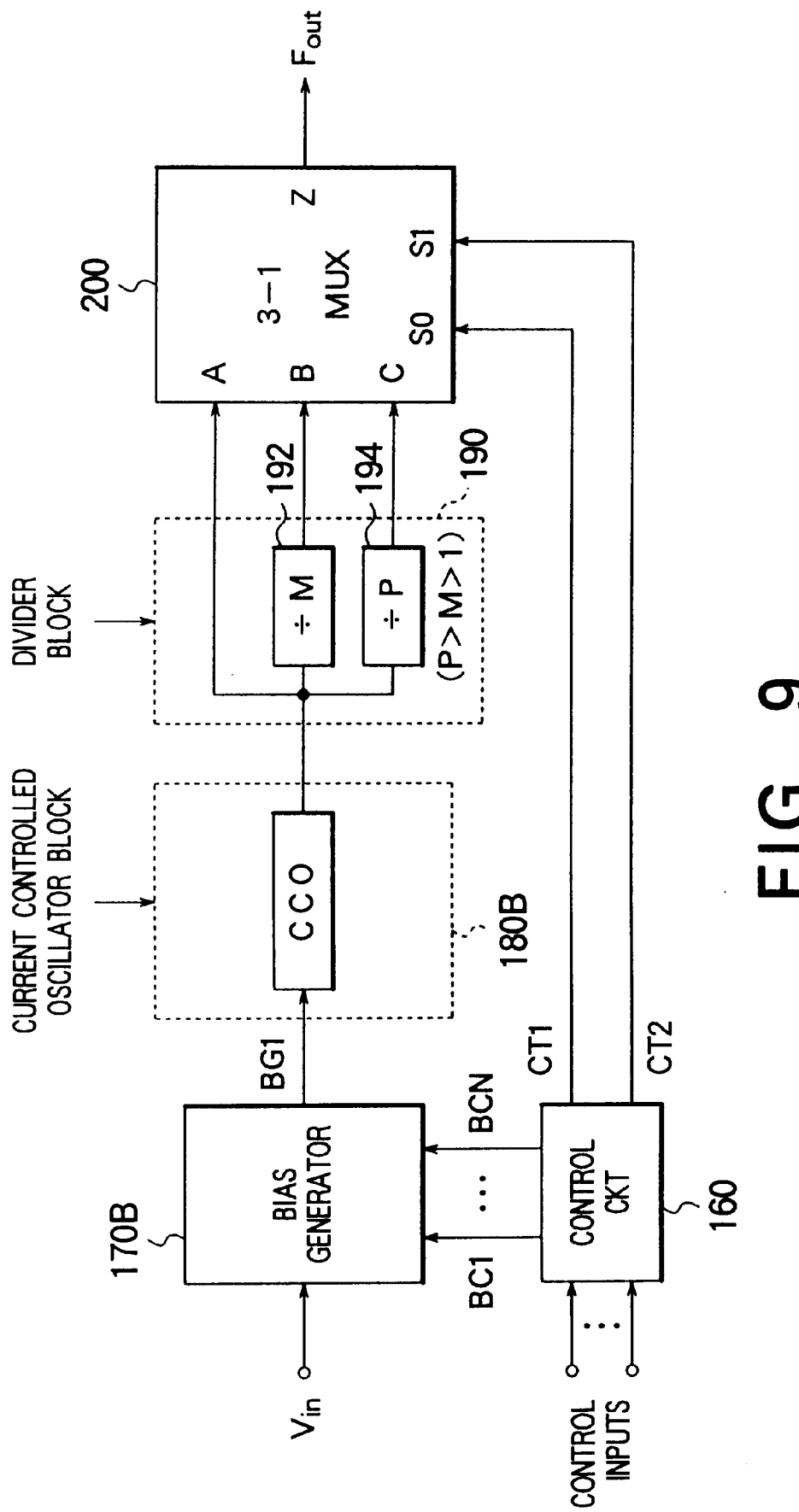
FIG. 9 shows a block diagram of a very low-gain voltage controlled oscillator according to a fourth embodiment of the invention.

A fourth embodiment of the invention is shown in FIG. 9. Note that it only use one current controlled oscillator namely CCO. The "A", "B" and "C" inputs of the 3–1 multiplexer 200 are used for "wst" case, "typ" case and "bst" case chips. While this embodiment cannot achieve as good performance as that shown in FIG. 6 or FIG. 11, it can be implemented in a much smaller area.

Figure 8:
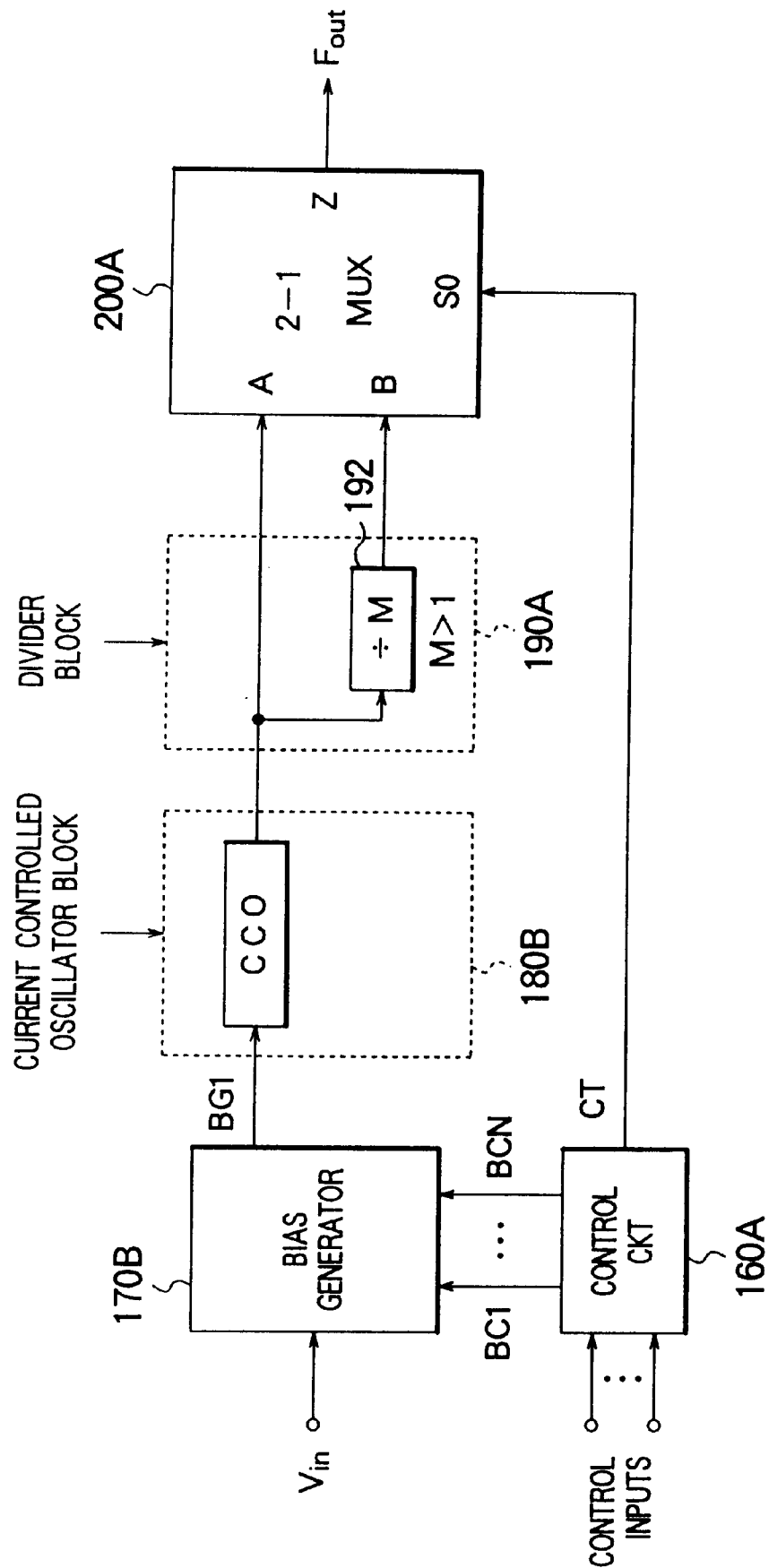
FIG. 8 shows a block diagram of a very low-gain voltage controlled oscillator according to a third embodiment of the invention.

A third embodiment of the invention is shown in FIG. 8. It uses only one divider as opposed to two in FIG. 9. Therefore while it cannot achieve an equivalent performance, it doesn't requires as much area.

Figure 10:
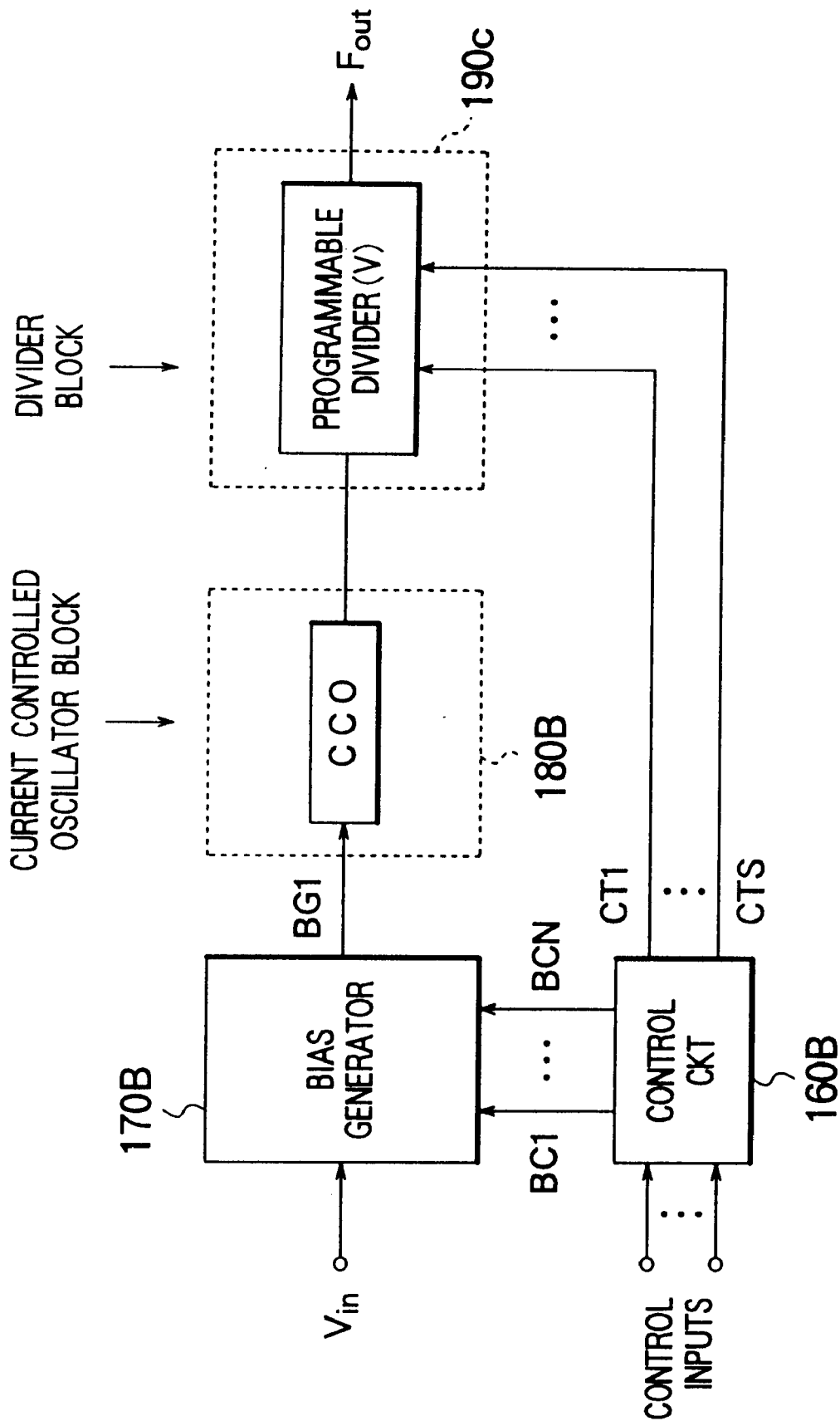
FIG. 10 shows a block diagram of a very low-gain voltage controlled oscillator according to a fifth embodiment of the invention.

A fifth embodiment shown in FIG. 10 achieves an equivalent performance of FIG. 8 and FIG. 9 by replacing the divider block and multiplexer block in FIG. 8 and FIG. 9 with a programmable divider block 190C.

This present invention guarantees that a VCO has vary low gain in the desired Fout(target) frequency range irrespective of process variations. Furthermore when incorporated in a PLL system, it guarantees that the PLL will lock to the desired Fout(target) frequency range, will display very low jitter irrespective of process variations and will be able to maintain this lock over a very wide operating temperature range.

While this invention has thus far been described in conjunction with several preferred embodiments thereof, it will now be readily possible for those skilled in the art to put this invention into practice in various other manner.

What is claimed is:

1. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block including one or more current controlled oscillators, each one of said one or more current controlled oscillators generating at a respective output, in response to a corresponding bias output signal supplied thereto, a unique frequency range for each unique input current range;

a bias generator, connected to each of said one or more current controlled oscillators in said current controlled oscillator block, for responding to a DC input voltage and bias control signals to produce one or more bias output signals to be supplied to each current controlled oscillator as the corresponding bias output signal, each bias output signal of said bias generator having a unique current range producing a unique frequency range at the output of each current controlled oscillator, said bias generator making only one of said one or more current controlled oscillators active at any one time by using said one or more bias output signals;

selecting means, connected to said current controlled oscillator block, for selecting, in response to selection control signals, one of the outputs of said one or more current controlled oscillators of said current controlled oscillator block and divided signals obtained by dividing the outputs of said one or more current controlled oscillators of said current controlled oscillator block to produce a single output frequency signal; and a control circuit, connected to said bias generator and said selecting means, for delivering to said bias generator said bias control signals to command said bias generator to define a unique current range in only one of said one or more current controlled oscillators at any given time and for delivering said selection control signals to said selecting means.

2. The very low-gain voltage controlled oscillator as claimed in claim 1, wherein said selecting means comprises:

a divider block, connected to said current controlled oscillator block, including a plurality of dividers with a plurality of division ratios; and a multiplexer, supplied with outputs of the dividers, for selecting, in response to said selection control signals, one of the outputs of the dividers as a selected signal, said multiplexer producing the selected one of the outputs of the dividers as the single output frequency signal.

3. The very low-gain voltage controlled oscillator as claimed in claim 1, wherein said current controlled oscillator block includes a plurality of current controlled oscillators, said selecting means consisting of a multiplexer, supplied with outputs of the current controlled oscillators, for selecting, in response to said selection control signals, one of the outputs of the current controlled oscillators, as a selected signal, said multiplexer producing said selected signal as the single output frequency signal.

4. The very low-gain voltage controlled oscillator as claimed in claim 1, wherein said current controlled oscillator block consists of only one current controlled oscillator, said selecting means consisting of a programmable divider for frequency dividing an output of the current controlled oscillator on the basis of a division ratio determined by said selection control signals to produce a divided signal as the single output frequency signal.

5. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of first through third current controlled oscillators each of which generates a unique frequency range for each unique input current range;

a bias generator, connected to the first through the third current controlled oscillators, for responding to a DC input voltage and bias control signals to supply first through third bias output signals to the first through the third current controlled oscillators, respectively, said bias generator having unique current ranges producing a unique frequency range at the output of the first through the third current controlled oscillators, said bias generator making only one current controlled oscillator active at any one time by using the bias output signals;

a divider block consisting of first and second dividers having fixed division ratios, respectively, the first divider having an input supplied with an output of the second current controlled oscillator, the second divider having an input supplied with an output of the third current controlled oscillator;

a 3–1 multiplexer having first through third input terminals, the first terminal being connected to an output of the first current controlled oscillator, the second input terminal being connected to an output of the first divider, the third input terminal being connected to an output of the second divider, said 3–1 multiplexer selecting, in response to selection control signals, one of its three input signals supplied to the first through the third input terminals to produce an output frequency signal; and a control circuit, connected to said bias generator and said 3–1 multiplexer, for delivering to said bias generator the bias control signals to command said bias generator to define a unique current range in only one of the first through the third current controlled oscillators at any given time and for producing the selection control signals which one of the first through the third input terminals of said 3–1 multiplexer is selected at any one time.

6. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of first and second current controlled oscillators each of which generates a unique frequency range for each unique input current range;

a bias generator, connected to the first and the second current controlled oscillators, for responding to a DC input voltage and bias control signals to supply first and second bias output signals to the first and the second current controlled oscillators, respectively, said bias generator having unique current ranges producing a unique frequency range at the output of the first and the second current controlled oscillators, said bias generator making only one current controlled oscillator active at any one time by using the bias output signals;

a divider block consisting of a divider having a fixed division ratio, the divider having an input supplied with an output of the second current controlled oscillator;

a 2–1 multiplexer having first and second input terminals, the first terminal being connected to an output of the first current controlled oscillator, the second input terminal being connected to an output of the divider, said 2–1 multiplexer selecting, in response to a selection control signal, one of its two input signals supplied to the first and the second input terminals to produce the output frequency signal; and a control circuit, connected to said bias generator and said 2–1 multiplexer, for delivering to said bias generator the bias control signals to command said bias generator to define a unique current range in only one of the first and the second current controlled oscillators at any given time and for producing the selection control signal which one of the first and the second input terminals of said 2–1 multiplexer is selected at any one time.

7. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of a current controlled oscillator which generates a unique frequency range for a unique input current range;

a bias generator, connected to the current controlled oscillator, for responding to a DC input voltage and bias control signals to supply a single bias output signal to the current controlled oscillator, said bias generator having a unique current range producing a unique frequency range at the output of the current controlled oscillator;

a divider block consisting of a divider having a fixed division ratio, the divider having an input supplied with an output of the current controlled oscillator;

a 2–1 multiplexer having first and second input terminals, the first terminal being connected to an output of the current controlled oscillator, the second input terminal being connected to an output of the divider, said 2–1 multiplexer selecting, in response to a selection control signal, one of its two input signals supplied to the first and the second input terminals to produce an output frequency signal; and a control circuit, connected to said bias generator and said 2–1 multiplexer, for delivering to said bias generator the bias control signals to command said bias generator to define a unique current range in the current controlled oscillator and for producing the selection control signal which one of the first and the second input terminals of said 2–1 multiplexer is selected at any one time.

8. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of a current controlled oscillator which generates a unique frequency range for a unique input current range;

a bias generator, connected to the current controlled oscillator, for responding to a DC input voltage and bias control signals to supply a single bias output signal to the current controlled oscillator, said bias generator having a unique current range producing a unique frequency range at the output of the current controlled oscillator;

a divider block consisting of first and second dividers having fixed division ratios, respectively, each of the first and the second dividers having an input supplied with an output of the current controlled oscillator;

a 3–1 multiplexer having first through third input terminals, the first terminal being connected to an output of the current controlled oscillator, the second input terminal being connected to an output of the first divider, the third input terminal being connected to an output of the second divider, said 3–1 multiplexer selecting, in response to selection control signals, one of its three input signals supplied to the first through the third input terminals to produce the output frequency signal; and a control circuit, connected to said bias generator and said 3–1 multiplexer, for delivering to said bias generator the bias control signals to command said bias generator to define a unique current range in the current controlled oscillator and for producing the selection control signals which one of the first through the third input terminals of said 3–1 multiplexer is selected at any one time.

9. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of a current controlled oscillator which generates a unique frequency range for a unique input current range;

a bias generator, connected to the current controlled oscillator, for responding to a DC input voltage and bias control signals to supply a single bias output signal to the current controlled oscillator, said bias generator having a unique current range producing a unique frequency range at the output of the current controlled oscillator;

a programmable divider having a variable division ratio, the programmable divider being for frequency dividing, in response to selection control signals, an output of the current controlled oscillator by the variable division ratio to produce an output frequency signal; and a control circuit, connected to said bias generator and said programmable divider, for delivering to said bias generator the bias control signals to command said bias generator to define a unique current range in the current controlled oscillator and for producing the selection control signals to set the division ratio of said programmable divider.

10. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of first through third current controlled oscillators each of which generates a unique frequency range for each unique input current range;

a bias generator, connected to the first through the third current controlled oscillators, for responding to a DC input voltage and bias control signals to supply first through third bias output signals to the first through the third current controlled oscillators, respectively, said bias generator having unique current ranges producing a unique frequency range at the output of the first through the third current controlled oscillators, said bias generator making only one current controlled oscillator active at any one time by using the bias output signals;

a 3–1 multiplexer having first through third input terminals which are connected to outputs of the first through the third current controlled oscillators, respectively, said 3–1 multiplexer selecting, in response to selection control signals, one of its three input signals supplied to the first through the third input terminals to produce the output frequency signal; and a control circuit, connected to said bias generator and said 3–1 multiplexer, for delivering to said bias generator the bias control signals to command said bias generator to define a unique current range in only one of the first through the third current controlled oscillators at any given time and for producing the selection control signals which one of the first through the third input terminals of said 3–1 multiplexer is selected at any one time.

11. A very low-gain voltage controlled oscillator which guarantees that a phase-locked loop circuit will lock with very low jitter irrespective of process variations and maintains this lock over a very wide operating temperature range, said very low-gain voltage controlled oscillator comprising:

a current controlled oscillator block consisting of first and second current controlled oscillators each of which generates a unique frequency range for each unique input current range;

a bias generator, connected to the first and the second current controlled oscillators, for responding to a DC input voltage and bias control signals to supply first and second bias output signals to the first and the second current controlled oscillators, respectively, said bias generator having unique current ranges producing a unique frequency range at the output of the first and the second current controlled oscillators, said bias generator making only one current controlled oscillator active at any one time by using the bias output signals;

a 2–1 multiplexer having first and second input terminals which are connected to outputs of the first and the second current controlled oscillators, respectively, said 2–1 multiplexer selecting, in response to a selection control signal, one of its two input signals supplied to the first and the second input terminals to produce an output frequency signal; and a control circuit, connected to said bias generator and said 2–1 multiplexer, for delivering to said bias generator the bias control signals to command said bias generator to define a unique current range in only one of the first and the second current controlled oscillators at any given time and for producing the selection control signal which one of the first and the second input terminals of said 2–1 multiplexer is selected at any one time.

* * * * *